United States Patent
Reyzin et al.

(10) Patent No.: US 7,422,052 B2
(45) Date of Patent: Sep. 9, 2008

(54) LOW PROFILE THERMOSIPHON

(75) Inventors: Ilya Reyzin, Williamsville, NY (US); Mohinder Singh Bhatti, Amherst, NY (US); Shrikant Mukund Joshi, Williamsville, NY (US)

(73) Assignee: Delphi Technologies, Inc., Troy, MI (US)

( * ) Notice: Subject to any disclaimer, the term of this patent is extended or adjusted under 35 U.S.C. 154(b) by 191 days.

(21) Appl. No.: 11/407,452

(22) Filed: Apr. 20, 2006

(65) Prior Publication Data

US 2007/0246197 A1    Oct. 25, 2007

(51) Int. Cl.
*F28D 15/02* (2006.01)

(52) U.S. Cl. ............ 165/80.3; 165/104.21; 165/104.33; 361/700

(58) Field of Classification Search ................ 165/80.3, 165/104.21, 104.33; 361/700
See application file for complete search history.

(56) References Cited

U.S. PATENT DOCUMENTS

| | | | | |
|---|---|---|---|---|
| 4,027,728 A | * | 6/1977 | Kobayashi et al. | 165/104.27 |
| 5,168,919 A | * | 12/1992 | Berenholz et al. | 165/80.4 |
| 5,613,552 A | * | 3/1997 | Osakabe et al. | 165/104.21 |
| 5,823,248 A | * | 10/1998 | Kadota et al. | 165/104.33 |
| 6,005,772 A | * | 12/1999 | Terao et al. | 361/699 |
| 6,076,596 A | * | 6/2000 | Osakabe et al. | 165/104.33 |
| 6,119,767 A | * | 9/2000 | Kadota et al. | 165/104.33 |
| 6,341,646 B1 | * | 1/2002 | Tanaka et al. | 165/104.33 |
| 6,588,498 B1 | | 7/2003 | Reyzin et al. | 165/104.33 |
| 6,834,713 B2 | * | 12/2004 | Ghosh et al. | 165/104.33 |
| 6,935,409 B1 | * | 8/2005 | Parish, IV et al. | 165/80.3 |

* cited by examiner

*Primary Examiner*—Teresa J Walberg
(74) *Attorney, Agent, or Firm*—Patrick M. Griffin

(57) ABSTRACT

A thermosiphon cooling assembly for dissipating heat generated by an electronic device includes a housing having a housing top, housing bottom and opposing sides. The opposing sides extend between the housing top and the housing bottom to define a low profile entrance and a low profile exit. A refrigerant is disposed within one or more boiling chambers. Heat generated by the electronic device is transferred to the refrigerant by the boiling chambers for liquid-to-vapor transformation. Condenser tubes having a bottom end and a top end extend from the boiling chambers at a diagonally upward angle across the sides between the housing bottom and housing top. The condenser tubes receive and condense vapor boiled off from the refrigerant. Air moving devices axially move air through the housing. Air is flowed across the condenser tubes to facilitate condensation.

12 Claims, 2 Drawing Sheets

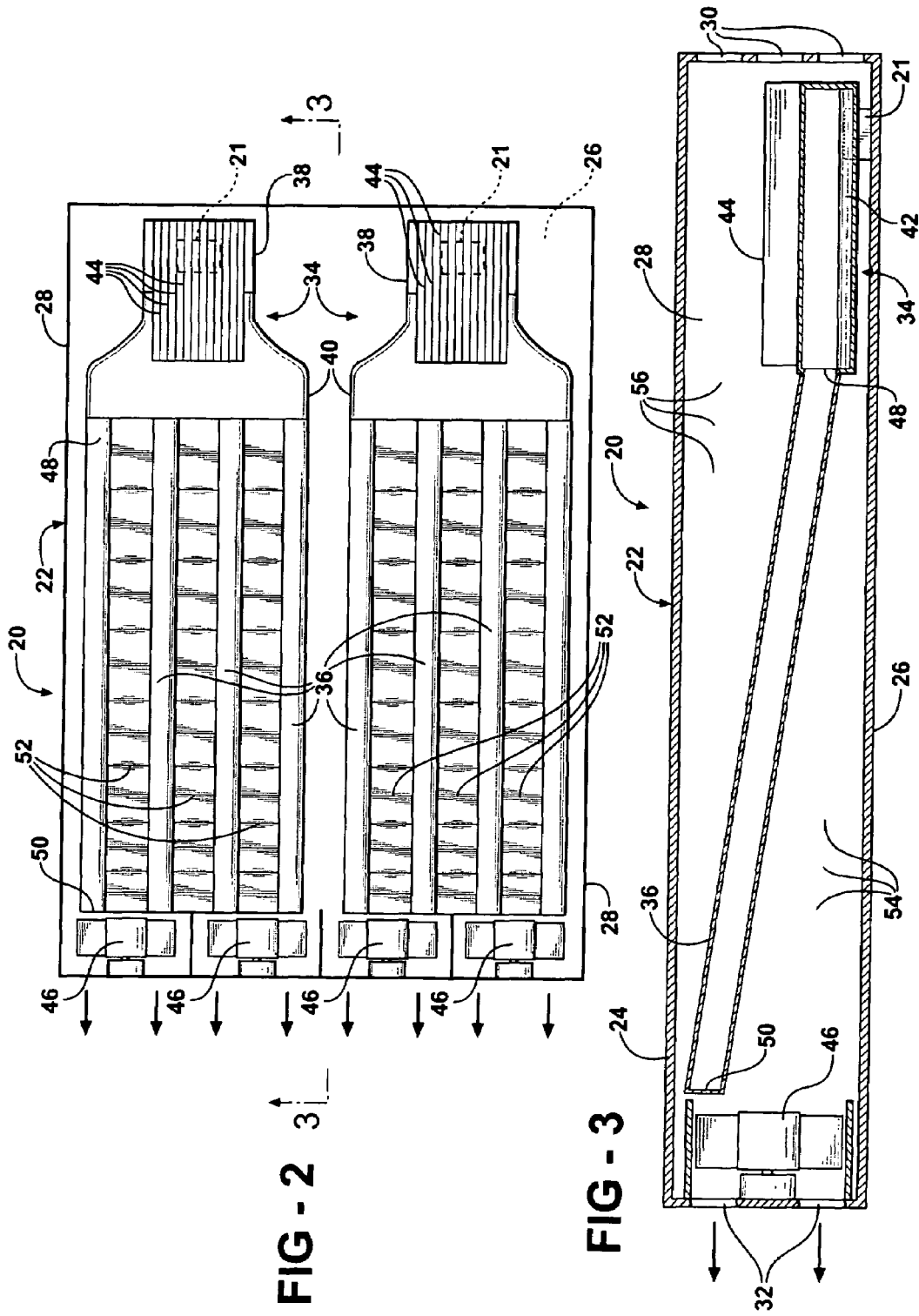

LOW PROFILE THERMOSIPHON

BACKGROUND OF THE INVENTION

1. Field of the Invention

The subject invention relates to a thermosiphon cooling assembly for dissipating heat generated by an electronic device.

2. Description of the Prior Art

Various thermosiphons for dissipating heat generated by an electronic device are well known in the prior art. A typical thermosiphon includes a refrigerant disposed in a boiling chamber. The boiling chambers absorb the heat generated by the electronic device and boil a refrigerant for liquid-to-vapor transformation to dissipate the heat. This process is governed by well-known general theories of nucleate boiling.

These thermosiphons typically include a housing, a boiling chamber, a refrigerant and one or more condenser tubes. The refrigerant is disposed in the boiling chamber. Heat generated by the electronic device is transferred to the refrigerant by the boiling chamber and boils of the refrigerant to generate vapor. The condenser tubes are typically disposed directly over the boiling chamber and extend upward directly to the housing top to receive the rising vapor. Flowing air through the air passages and across the condenser fins can cool the condenser tubes. The cool temperature surrounding condenser tubes transforms the vapor into cool liquid. The condensed liquid is returned to the boiling chamber via gravity. The heat is transferred to an air stream that flows over a finned external surface coupled to the condenser tubes and is exited from the housing. A thermosiphon assembly as described above is disclosed in U.S. Pat. No. 6,588,498 to Reyzin et al.

Various compact electronic devices desire low profile thermosiphons. However, the condenser tubes included with traditional thermosiphon assemblies provide a minimum height impracticable for implementing in compact electronic devices. Therefore, what is desired is a low profile thermosiphon assembly that utilizes the processes of heat transfer, boiling and condensation to dissipate heat generated by an electronic device.

SUMMARY OF THE INVENTION AND ADVANTAGES

The invention provides a thermosiphon cooling assembly for dissipating heat generated by an electronic device. The invention comprises a housing defined by opposing sides between a housing top and a housing bottom. The invention further comprises a boiling chamber including a section overlaying the electronic device and a refrigerant disposed within the boiling chamber that is heated by the electronic device for transforming into vapor. A condenser tube extends from the boiling chamber for condensing the vapor. The invention is distinguished by the condenser tube extending at a diagonally upward angle from the housing bottom and adjacent to the boiling chamber to the housing top.

By extending the condenser tube at a diagonally upward angle from the housing bottom to the housing top, the height of housing can be decreased. Accordingly, a low profile thermosiphon having a height no more than 1.75 inches can be achieved that may be utilized with compact electronic devices. Additionally, air moving devices can move air axially through the thermosiphon and across the condenser tube to facilitate condensation.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 2 is a top view of the thermosiphon assembly illustrated in FIG. 1 without the housing; and FIG. 3 is a longitudinal cross-sectional view taken along line 3-3 of the thermosiphon assembly illustrated in FIG. 2.

DETAILED DESCRIPTION OF THE INVENTION

Figure 1:
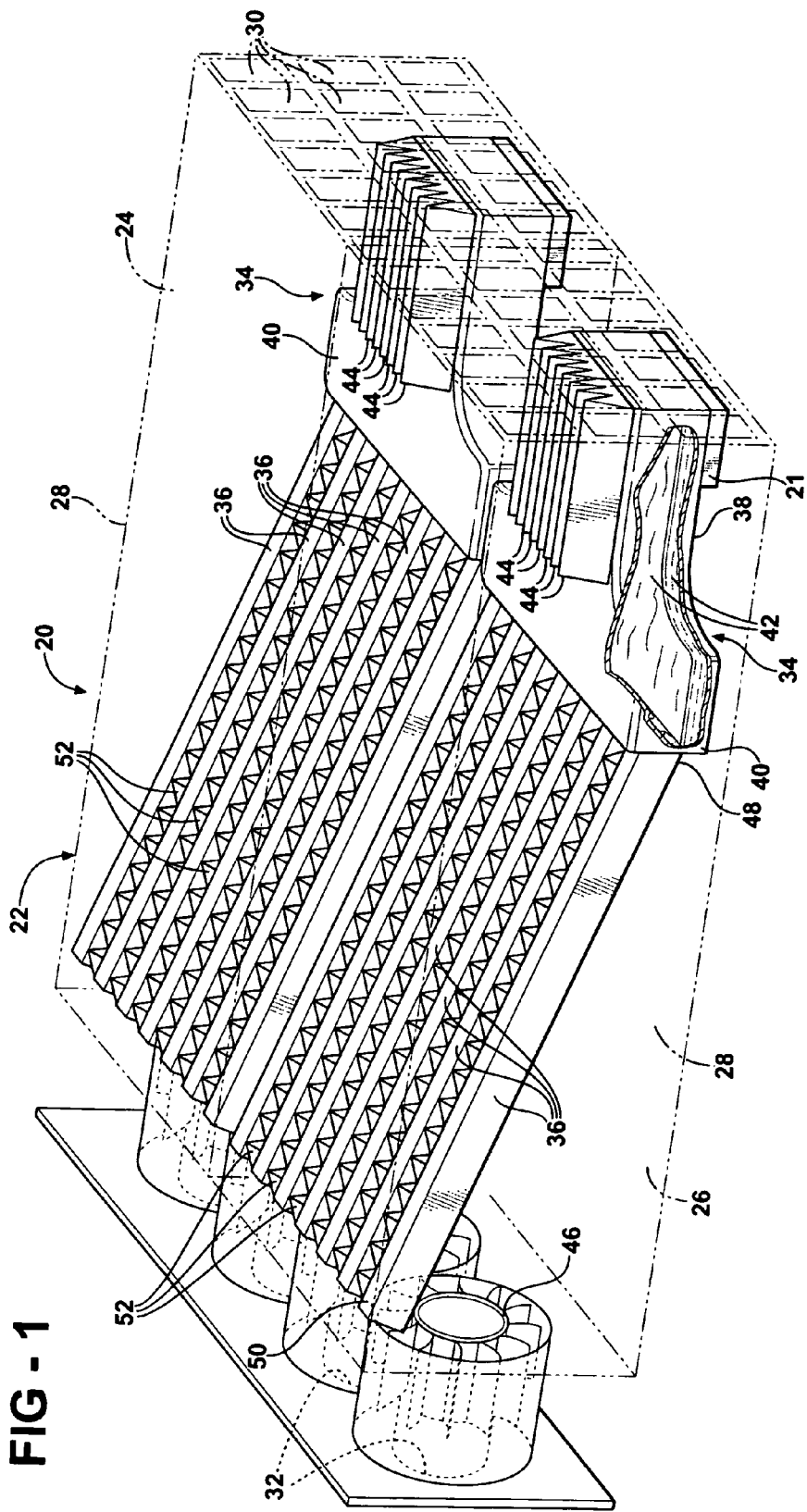
FIG. 1 is a perspective view of a low profile thermosiphon assembly having condenser tubes extending at a diagonally upward angle according to the present invention.

Referring to the Figures, wherein like numerals indicate corresponding parts throughout the several views, a thermosiphon cooling assembly 20 is generally shown in FIGS. 1, 2 and 3 for dissipating heat generated by an electronic device 21.

The assembly 20 comprises a housing 22 generally indicated having a generally rectangular periphery. The housing 22 is defined by a housing top 24, a housing bottom 26, and opposing sides 28 that can be solid. The housing sides 28 extend between the housing top 24 and housing bottom 26 to define a low profile entrance 30 and a low profile exit 32. The entrance 30 and exit 32 are perforated or define openings to allow air to flow through the housing 22. In the preferred embodiment, the housing 22 extends no more than 1.75 inches between the housing top 24 and the housing bottom 26.

The thermosiphon assembly 20 includes a plurality of boiling chambers 34, each generally shown, and a plurality of condenser tubes 36. The boiling chambers 34 are disposed on the housing bottom 26 adjacent to the entrance 30. Although one long boiler chamber may be used, a plurality of boiling chambers 34 is illustrated. The boiling chambers 34 include a flat-box-like section 38 for overlaying the electronic device 21 and a fan-like section 40 is defined by a set of opposing chamber sides diverging outward from the boiling chamber 34. The fan-like section 40 is in fluid communication with the condenser tubes 36. A refrigerant 42 is disposed in each of the boiling chambers 34. Heat generated by the electronic device 21 is transferred by the boiling chamber 34 to the refrigerant 42 for liquid-to-vapor transformation, as discussed further below. A plurality of boiling chamber fins 44 are disposed against the box-like sections 38. The boiling chamber fins 44 extend upward for increasing heat transfer.

The assembly 20 includes a plurality of air moving devices 46 comprising cooling fans. The air moving devices 46 move air axially through the housing 22 from the entrance 30 to the exit 32. Although four air moving devices 46 are illustrated in FIGS. 1 and 2, more or less air moving devices 46 may be used. Also, the air moving devices 46 can be coupled to the housing 22 as illustrated in FIGS. 1, 2, and 3, or can be a separate unit. Additionally, the air moving devices 46 may be disposed across the exit 32 as illustrated in FIGS. 1, 2, and 3, or may be disposed across the entrance 30, not shown.

The condenser tubes 36 include a bottom end 48 and a closed top end 50 and extend from the fan-like section 40 of the boiling chambers 34. A plurality of condenser fins 52 extend between the condenser tubes 36 to define airflow passages extending transversely to the condenser tubes 36. Air generated by the air moving devices 46 flows through the passages and across the condenser fins 52 for cooling the condenser tubes 36. The condenser fins 52 can be non-uniformly spaced apart for varying the size of the air passages.

For example, the spacing may decrease as the condenser fins 52 traverse from the bottom end 48 to the top end 50. The non-uniform spacing directs airflow toward the bottom end 48 and enhances air flow.

The assembly 20 is distinguished by the condenser tubes 36 extending at a diagonally upward angle from the housing bottom 26 adjacent to the fan-like section 40 of the boiling chambers 34 to the housing top 24. As illustrated in FIG. 3, the condenser tubes 36 define a wedge shaped exit air plenum 54 and a wedge shaped entrance air plenum 56. The wedge shaped exit air plenum 54 is defined over the housing bottom 26 and below the condenser tubes 36. The wedge shaped entrance air plenum 56 is defined under the housing top 24 and above the condenser tubes 36 and above the boiling chambers 34. The condenser tubes 36 direct vapor boiled off the refrigerant 42 upward and diagonally away from the boiling chambers 34, as discussed in greater detail below.

The assembly 20 is highly responsive to the instantaneous thermal load imposed on the boiling chamber 34 generated by the electronic device 21. More specifically, the thermal load increases as the refrigerant 42 is heated by the electronic device 21 through the boiling chamber 34 and the boiling chamber fins 44. As the refrigerant 42 is heated, the liquid refrigerant 42 changes to a vapor. The vapor is directed upward diagonally through the condenser tubes 36. Air drawn by the air moving devices 46 enters the housing 22 through the entrance 30 and flows across the boiling chambers 34. Air flows through the air passages and across the condenser fins 52 and the diagonally disposed condenser tubes 36 before exiting the housing 22. The air flow dissipates the heat generated by the electronic device 21 and condenses the vapor to a cool liquid within the condenser tubes 36. As the vapor is condensed, heat is mixed with the airflow and exited from the housing 22. The condensed liquid returns to the boiling chamber 34 via gravity for re-vaporization.

Obviously, many modifications and variations of the present invention are possible in light of the above teachings. The invention may be practiced otherwise than as specifically described within the scope of the appended claims.

What is claimed is:

1. A thermosiphon cooling assembly for dissipating heat generated by an electronic device comprising;
    a housing having a housing top and a housing bottom and opposing sides extending therebetween to define a low profile entrance and a low profile exit,
    a boiling chamber including a section for overlaying the electronic device,
    a refrigerant disposed within said boiling chamber for being heated by the electronic device and for transforming into vapor,
    a condenser tube having a bottom end and a top end and extending from said boiling chamber for condensing the vapor, said condenser tube extending at a diagonally upward angle across said sides between said housing bottom and said housing top for defining a wedge shaped exit air plenum on one side of said condenser tube and a wedge shaped entrance air plenum on the other side of said condenser tube;
    a plurality of said condenser tubes extending at a diagonally upward angle from said housing bottom adjacent to said boiling chambers to said housing top adjacent to said exit; and
    a plurality of condenser fins extending between said condenser tubes to define airflow passages extending transversely to said condenser tubes;
    wherein said plurality of condenser fins are spaced non-uniformly apart and disposed from each other at a distance that decreases as said plurality of condenser fins traverse from said housing bottom to said housing top.

2. An assembly as set forth in claim 1 wherein said opposing sides are solid extending between said low profile entrance and said low profile exit.

3. An assembly as set forth in claim 2 wherein each of said opposing sides extend no more than 1.75 inches between said housing top and said housing bottom.

4. An assembly as set forth in claim 2 wherein said housing is generally rectangular.

5. An assembly as set forth in claim 2 wherein said boiling chamber includes a flat-box-like section for overlaying the electronic device.

6. An assembly as set forth in claim 4 wherein said boiling chamber includes a set of opposing chamber sides diverging outward from said boiling chamber to define a fan-like section in fluid communication with a plurality of said condenser tubes.

7. An assembly as set forth in claim 4 wherein said boiling chamber includes boiling chamber fins disposed against said box-like section and extending upward for increasing heat transfer.

8. An assembly as set forth in claim 4 wherein said boiling chamber is disposed adjacent to said entrance.

9. An assembly as set forth in claim 4 including a plurality of air moving devices for moving air axially through said housing from said entrance to said exit across said diagonally disposed condenser tubes.

10. An assembly as set forth in claim 8 wherein said air moving devices are fans.

11. An assembly as set forth in claim 9 wherein said air moving devices are disposed across one of said exit and said entrance.

12. A thermosiphon cooling assembly for dissipating heat generated by an electronic device comprising;
    a housing having a generally rectangular periphery defining a housing top and a housing bottom with opposing sides being solid extending no more than 1.75 inches between said housing top and said housing bottom,
    said housing bottom and said opposing sides and said top and bottom extending axially to define a low profile entrance and a low profile exit at opposite axially spaced ends of said housing,
    a plurality of fans disposed side-by-side across said exit for moving air from said entrance to said exit,
    a plurality of boiling chambers disposed on said housing bottom adjacent to said entrance with said boiling chambers including a flat-box-like section for overlaying the electronic device with a set of opposing chamber sides diverging outward from said boiling chamber defining a fan-like section,
    a refrigerant disposed in each of said boiling chambers for liquid-to-vapor transformation,
    a plurality of boiling chamber fins disposed against each of said flat-box-like sections and extending upward to increase heat transfer,
    a plurality of condenser tubes having a bottom end and a top end extending from each of said boiling chambers for condensing vapor boiled off said refrigerant in said boiling chambers by heat transferred from the electronic devices,
    a plurality of condenser fins spaced non-uniformly apart having a distance between each condenser fin that decreases as said condenser fins traverse from the bottom end to the top end and extending between said condenser tubes to define airflow passages extending transversely to said condenser tubes, said condenser tubes extending diagonally across said axis at an upward angle from said housing bottom adjacent to said diverging section of said boiling chambers to said housing top adjacent to said fans for defining a wedge shaped exit air plenum over said housing bottom and below said condenser tubes and a wedge shaped entrance air plenum under said housing top and above said condenser tubes and above said boiling chambers, whereby heat transferred by the electronic device boils said refrigerant to generate vapor that is received by said condenser tubes and that is condensed by heat transferred via said condenser fins to said air moved axially by said plurality of fans from said entrance to said exit and across said diagonally disposed condenser tubes.

* * * * *